(12) United States Patent
Park

(10) Patent No.: US 8,184,499 B2
(45) Date of Patent: May 22, 2012

(54) SEMICONDUCTOR MEMORY APPARATUS

(75) Inventor: Heat Bit Park, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 111 days.

(21) Appl. No.: 12/650,666

(22) Filed: Dec. 31, 2009

(65) Prior Publication Data
US 2011/0103160 A1     May 5, 2011

(30) Foreign Application Priority Data

Oct. 30, 2009   (KR) .................. 10-2009-0104387

(51) Int. Cl.
    *G11C 8/00*   (2006.01)
(52) U.S. Cl. ....... 365/230.01; 365/230.03; 365/189.011; 365/189.14; 365/189.15; 365/194
(58) Field of Classification Search ............. 365/230.01, 365/230.03, 189.011, 189.14, 189.15, 189.16, 365/194
    See application file for complete search history.

(56) References Cited

U.S. PATENT DOCUMENTS

| | | | |
|---|---|---|---|
| 6,101,147 A | 8/2000 | Takahashi et al. | |
| 6,456,558 B1 | 9/2002 | Cho | |
| 6,564,287 B1 | 5/2003 | Lee | |
| 6,636,446 B2 | 10/2003 | Lee et al. | |
| 6,819,623 B2 | 11/2004 | Jung | |
| 7,055,012 B2 | 5/2006 | LaBerge et al. | |
| 2001/0000687 A1* | 5/2001 | Kitsukawa et al. | ............ 365/63 |
| 2005/0105363 A1 | 5/2005 | Ko | |
| 2005/0201183 A1 | 9/2005 | Ho | |

FOREIGN PATENT DOCUMENTS

| JP | 09-045083 | 2/1997 |
|---|---|---|
| KR | 1020060090384 | 8/2006 |

OTHER PUBLICATIONS

Heat Bit Park, New Patent Application entitled "Semiconductor Memory Apparatus," filed Dec. 30, 2009 in U.S. Patent and Trademark Office.

* cited by examiner

*Primary Examiner* — Thong Q Le
(74) *Attorney, Agent, or Firm* — William Park & Associates Ltd.

(57) ABSTRACT

A semiconductor memory apparatus is provided. The semiconductor memory apparatus comprises: first and second memory banks located a predetermined distance from each other in a first direction; a common column selection control unit located at an outside region in the first and second memory banks in the first direction, and configured to commonly control access to column areas in the first and second memory banks and generate a column selection signal that controls data access to the corresponding memory cells in the first and second memory banks; a first data read/write unit configured to sense and amplify read data transferred from the first memory bank and transfer write data to the first memory bank; and a second data read/write unit configured to sense and amplify read data transferred from the second memory bank and transfer write data to the second memory bank. The first data read/write unit and the second data read/write unit are located so as to be spaced from each other in the first direction with the memory bank interposed therebetween.

8 Claims, 4 Drawing Sheets

SEMICONDUCTOR MEMORY APPARATUS

CROSS-REFERENCE TO RELATED APPLICATION

The present application claims priority under 35 U.S.C. §119(a) to Korean Patent Application No. 10-2009-0104387, filed on Oct. 30, 2009, in the Korean Intellectual Property Office, which is incorporated herein by reference in its entirety as if set forth in full.

BACKGROUND

1. Technical Field

Various aspects of the present disclosure generally relate to a semiconductor memory apparatus, and more particularly, to a technology which reduces a skew between internal signals.

2. Related Art

A semiconductor memory apparatus has an internal memory area divided into multiple memory banks. Each of the multiple memory banks may be selectively enabled by a bank address signal. Generally, the arrangement structure in multiple memory banks and internal circuits is determined by the operational performance and spatial efficiency.

FIG. 1 illustrates an internal structure in a typical semiconductor memory apparatus.

Referring to FIG. 1, a typical semiconductor memory apparatus 1 comprises first memory banks BANK0_0 and BANK0_1 110 and 120, second memory banks BANK1_0 and BANK1_1 210 and 220, first to fourth column selection control units 111, 121, 211 and 221, first to fourth data write units 112, 122, 212 and 222, and first to fourth data read units 113, 123, 213 and 223.

For reference, the first memory banks BANK0_0 and BANK0_1 110 and 120 may be divided into a first sub bank 110 and a second sub bank 120, and the second memory banks BANK1_0 and BANK1_1 210 and 220 may be divided into a third sub bank 210 and a fourth sub bank 220. The memory banks which may be each selectively enabled by a bank address signal may be arranged to be physically divided into multiple sub banks.

Circuits configured to control access to row areas in the memory banks may be provided in row control areas XLOGIC 311 and 312, and drivers and repeaters for various internal signals may be provided in a cross area XY CROSS 320.

The first data write unit 112 is configured to transfer write data to the first sub bank 110, and the first data read unit 113 is configured to sense and amplify read data transferred from the first sub bank 110. The second data write unit 122 is configured to transfer write data to the second sub bank 120, and the second data read unit 123 is configured to sense and amplify read data transferred from the second sub bank 120. The third data write unit 212 is configured to transfer write data to the third sub bank 210, and the third data read unit 213 is configured to sense and amplify read data transferred from the third sub bank 210. The fourth data write unit 222 is configured to transfer write data to the fourth sub bank 220, and the fourth data read unit 223 is configured to sense and amplify read data transferred from the fourth sub bank 220.

Meanwhile, each in the first to fourth column selection control units 111, 121, 211 and 221 is configured to control access to each column area in the first memory banks BANK0_0 and BANK0_1 110 and 120 and the second memory banks BANK1_0 and BANK1_1 210 and 220, respectively. The basic operations in the first to fourth column selection control units 111, 121, 211 and 221 may be identical to one another. Therefore, the internal operation in the first column selection control unit 111 and the related internal circuits therein will be described in detail as a representative example.

Column selection signals YI<0> to YI<i> generated by the first column selection control unit 111 control data access to the corresponding memory cell in the first sub bank 110 located within the first memory bank. The column selection signals YI<0> to YI<i> may be transferred through transmission lines to the first sub bank 110. For example, when a specific column selection signal YI<k> is activated, data access to the corresponding memory cell is performed. Thus, in the data read mode, the first data read unit 113 senses and amplifies read data which is transferred from the corresponding memory cell. In the data write mode, the first data write unit 112 transfers write data to the corresponding memory cell.

As described above, the typical semiconductor memory apparatus 1 comprises the column selection control unit provided in each memory bank. In the above example, the column selection control unit is in each sub bank in the memory bank. Such a structure needs a large chip area when the column selection control units may be arranged. Therefore, there is a need for technology which solves the above-described problems, without degrading the performance in the access to the column area.

SUMMARY

Accordingly, there is a need for an improved semiconductor memory apparatus that overcomes the problems discussed above. To attain the advantages in accordance with the purposes in the invention, as embodied and broadly described herein, various aspects in the invention may provide a semiconductor memory apparatus comprising: first and second memory banks located a predetermined distance from each other, a common column selection control unit located at an outside region in the first and second memory banks in the first direction and configured to commonly control access to column areas in the first and second memory banks and generate a column selection signal that controls data access to the corresponding memory cells in the first and second memory banks, a first data read/write unit configured to sense and amplify read data transferred from the first memory bank and transfer write data to the first memory bank, a second data read/write unit configured to sense and amplify read data transferred from the second memory bank and transfer write data to the second memory bank. The memory bank is located between the first data read/write unit and the second data read/write unit.

BRIEF DESCRIPTION OF THE DRAWINGS

The accompanying drawings, which are incorporated in and constitute a part in this specification, illustrate various embodiments consistent with the invention, and, together with the description, serve to explain the principles in the invention.

DETAILED DESCRIPTION

Figure 1:
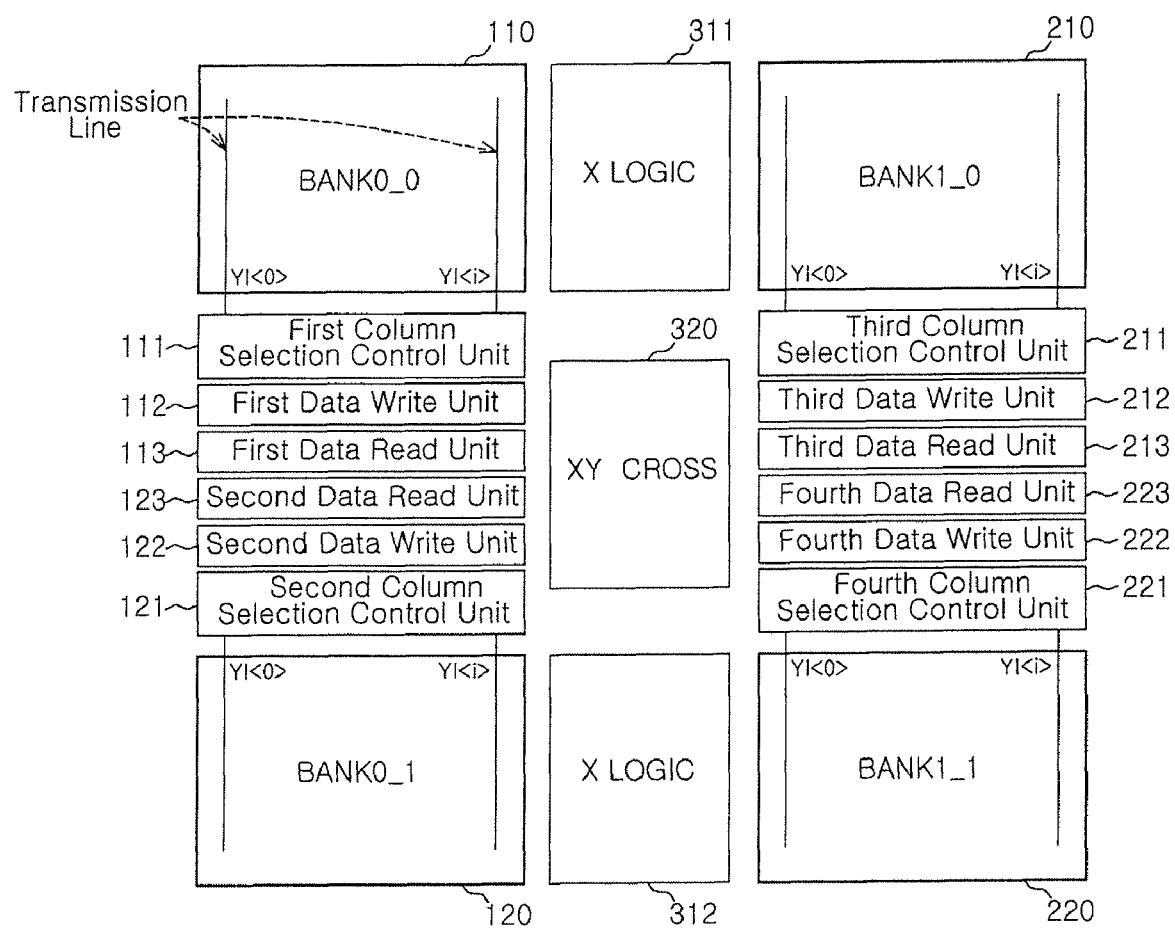
FIG. 1 illustrates an exemplary internal structure in a typical semiconductor memory apparatus.

Reference will now be made in detail to the exemplary embodiments consistent with the present disclosure, examples in which are illustrated in the accompanying drawings. Wherever possible, the same reference characters will be used throughout the drawings to refer to the same or like parts.

Figure 2:
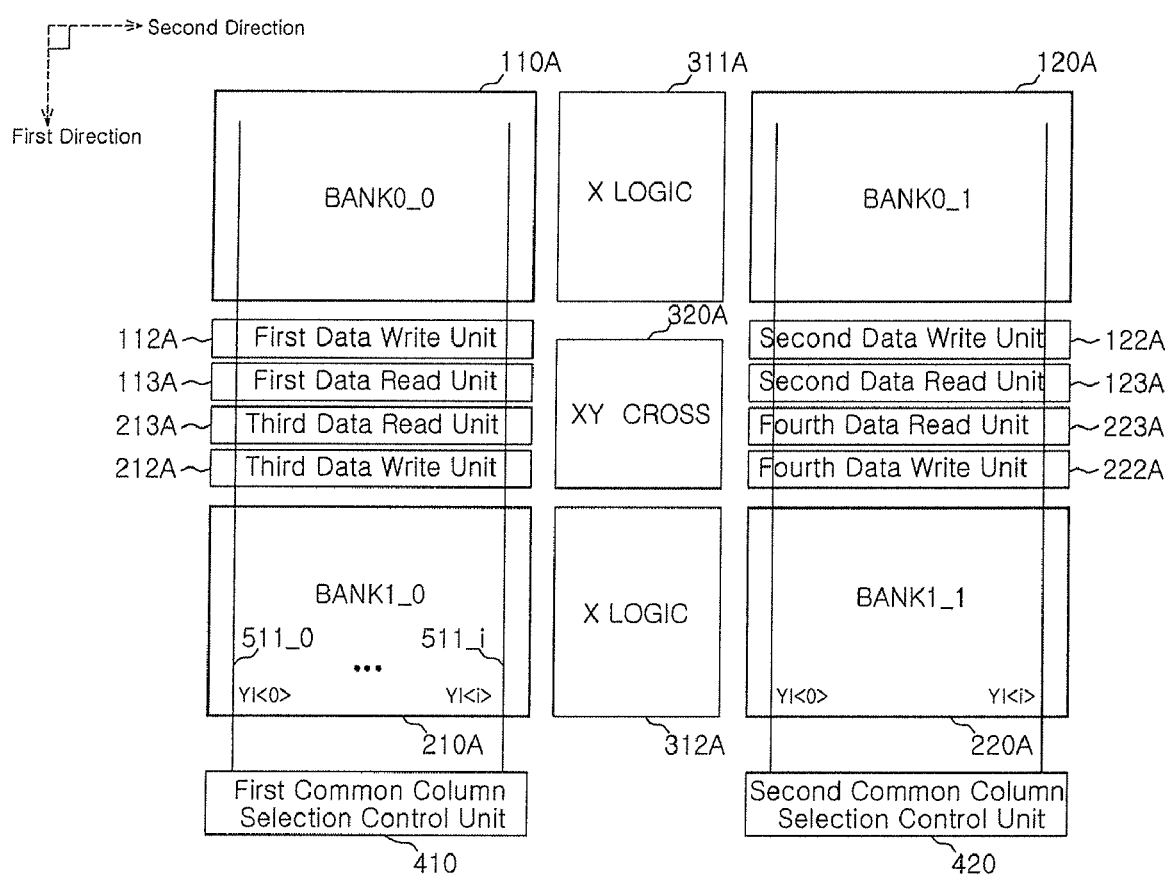
FIG. 2 illustrates an internal structure in a semiconductor memory apparatus according to one aspect.

FIG. 2 illustrates an internal structure in a semiconductor memory apparatus according to one aspect in the invention.

The semiconductor memory apparatus 2 according to this aspect comprises only components for illustrating the internal structure clearly. Those skilled in the art will readily understand that the semiconductor memory apparatus 2 may include other components as well.

Referring to FIG. 2, the semiconductor memory apparatus 2 comprises first memory banks BANK0_0 and BANK0_1 110A and 120A, second memory banks BANK1_0 and BANK1_1 210A and 220A, first and second common column selection control units 410 and 420, first to fourth data write units 112A, 122A, 212A, and 222A, and first to fourth data read units 113A, 123A, 213A, and 223A.

For reference, the first memory banks BANK0_0 and BANK0_1 110A and 120A may be divided into first and second sub banks 110A and 120A, and the second memory banks BANK1_0 and BANK1_1 210A and 220A may be divided into third and fourth sub banks 210A and 220A. As such, the memory banks which each may be selectively activated by a bank address signal may be arranged so as to be physically divided into multiple sub banks.

Now, the detailed configuration and the main operation in the semiconductor memory apparatus configured in the manner described above will be explained The first memory banks BANK0_0 and BANK0_1 110A and 120A and the second memory banks BANK1_0 and BANK1_1 210A and 220A are located at a predetermined distance from each other, respectively, in a first direction.

Circuits configured to control access to row areas in the memory banks are provided in row control areas X LOGIC 311A and 312A, and drivers and repeaters for various internal signals are provided in a cross area XY CROSS 320A. The first row control area 311A is located between the first sub bank 110A and the second sub bank 120A in a second direction, and the second row control area 312A is located between the third sub bank 210A and the fourth sub bank 220A in the second direction. The cross area XY CROSS 320A is located between the first row control area 311A and the second row control area 312A in the first direction, respectively. The first and second directions are perpendicular to each other.

The first data write unit 112A is configured to transfer write data to the first sub bank 110A, and the first data read unit 113A is configured to sense and amplify read data transferred from the first sub bank 110A. Likewise, the second data write unit 122A is configured to transfer write data to the second sub bank 120A, and the second data read unit 123A is configured to sense and amplify read data transferred from the second sub bank 120A. The third data write unit 212A is also configured to transfer write data to the third sub bank 210A and the third data read unit 213A is configured to sense and amplify read data transferred from the third sub bank 210A. The fourth data write unit 222A is configured to transfer write data to the fourth sub bank 220A, and the fourth data read unit 223A is configured to sense and amplify read data transferred from the fourth sub bank 220A.

The first common column selection control unit 410 is configured to control access to column areas in the first sub bank 110A in the first memory banks and the third sub bank 210A in the second memory banks. The second common column selection control unit 420 may be configured to control access to column areas in the second sub bank 120A in the first memory banks and the fourth sub bank 220A in the second memory banks. For example, the first and second common column selection control unit 410 and 420 commonly control the first and second memory banks. The basic operations in the first and second common column selection units 410 and 420 are identical. Therefore, the internal operation in the first common column selection unit 410 and the related internal circuits therein will be described in detail, but only as a representative example that the disclosure is not limited to.

Column selection signals YI<0> to YI<i> generated by the first common column selection control unit 410 control data access to the corresponding memory cells in the first sub bank 110A in the first memory banks and the third sub bank 210A in the second memory banks. The column selection signals YI<0> to YI<i> are transferred to the first sub bank 110A and the third sub bank 210A through common column selection signal transmission lines 511_0 to 511_i. As described above, multiple memory banks may be selectively activated by a bank address signal. Although a specific column selection signal YI<k> is commonly transferred to the first sub bank 110A in the first memory banks and the third sub bank 210A in the second memory banks through a common column selection signal transmission lines 511_0 to 511_i, the semiconductor memory apparatus can perform a normal operation.

When the first sub bank 110A in the first memory banks and the specific column selection signal YI<k> are activated, data access to the corresponding memory cell in the first sub bank 110A is allowed. Therefore, the first data read unit 113A senses and amplifies read data transferred from the corresponding memory cell in the data read mode. The first data write unit 112A transfers write data to the corresponding memory cell in the data write mode. For reference, the column selection signal is a signal which is activated in response to a column address signal.

When the third sub bank 210A of the second memory banks and the specific column selection signal YI<k> are activated, data access to the corresponding memory cell in the third sub bank 210A is allowed. Therefore, the third data read unit 213A senses and amplifies read data transferred from the corresponding memory cell in the data read mode. The third data write unit 212A transfers write data to the corresponding memory cell in the data write mode.

The semiconductor memory apparatus 2 configured in such a manner commonly controls the access to the column areas in the first and second memory banks through the common column selection control unit. Therefore, a chip area required for disposing the circuits is not required.

Figure 3:
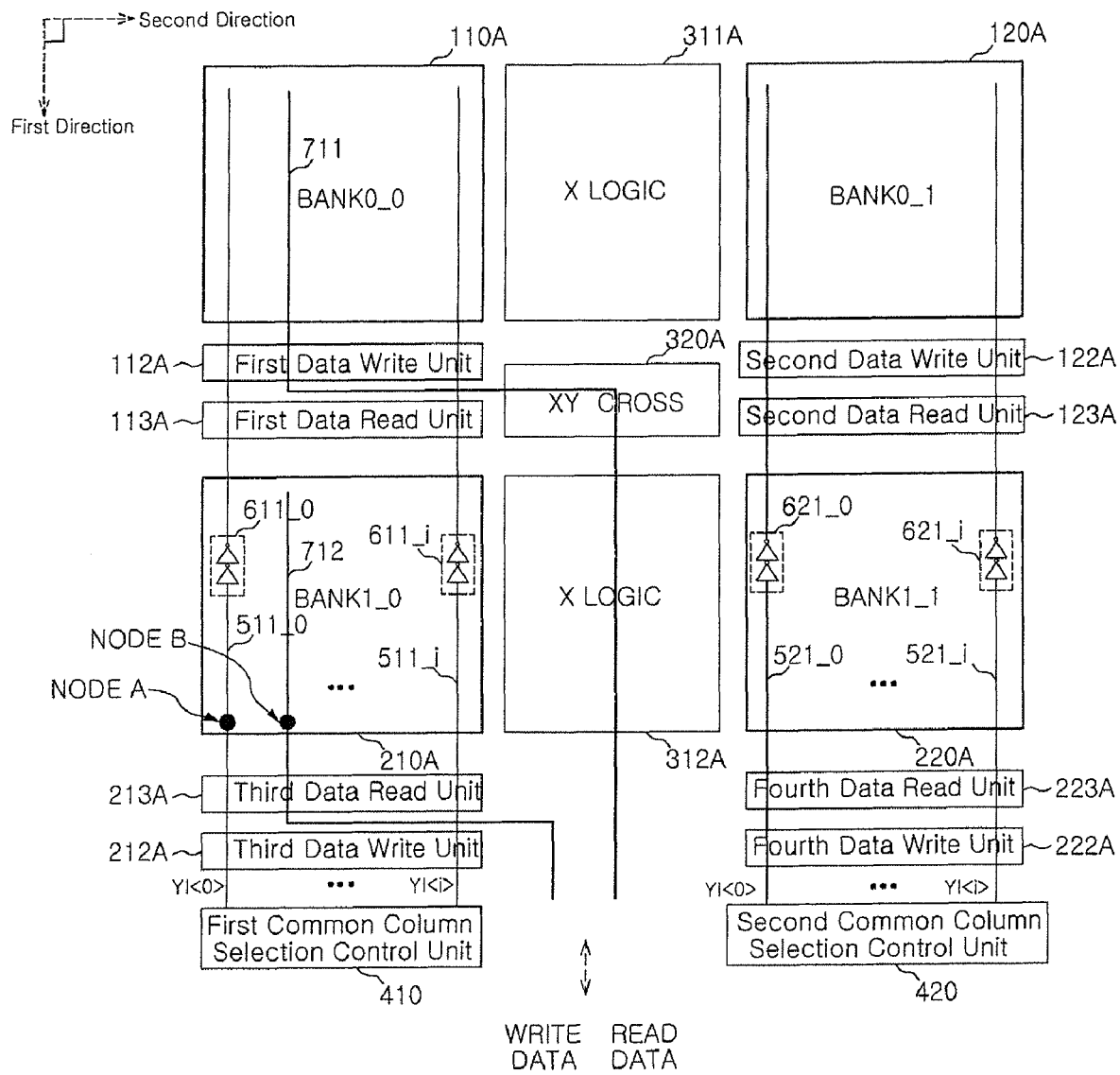
FIG. 3 illustrates an internal structure in a semiconductor memory apparatus according to another aspect.

FIG. 3 illustrates an internal structure in a semiconductor memory apparatus according to another aspect of the invention.

According to this aspect, the semiconductor memory apparatus 3 is only comprised of components that illustrate the proposed technical ideas.

Referring to FIG. 3, the semiconductor memory apparatus 3 comprises first memory banks BANK0_0 and BANK0_1 110A and 120A, second memory banks BANK1_0 and BANK1_1 210A and 220A, first and second common column selection units 410 and 420, first data read and write units 113A and 112A, second data read and write units 123A and 122A, third data read and write units 213A and 212A, and fourth data read and write units 223A and 222A.

For reference, the first memory banks BANK0_0 and BANK0_1 110A and 120A are divided into first and second sub banks 110A and 120A, and the second memory banks BANK1_0 and BANK1_1 210A and 220A are divided into third and fourth sub banks 210A and 220A. As such, the memory banks which are selectively activated by a bank address signal may be arranged so as to be physically divided into the plurality of sub banks.

The first memory banks BANK0_0 and BANK0_1 110A and 120A and the second memory banks BANK1_0 and BANK1_1 210A and 220A may be located at a predetermined distance from each other in a first direction.

Circuits configured to control access to row areas in the memory banks are provided in row control areas X LOGIC 311A and 312A, and drivers and repeaters for various internal signals are provided in a cross area XY CROSS 320A. The first row control area 311A is located between the first sub bank 110A and the second sub bank 120A in a second direction, and the second row control area 312A is located between the third sub bank 210A and the fourth sub bank 220A in the second direction. The cross area XY CROSS 320A is located between the first row control area 311A and the second row control area 312A in the first direction. The first and second directions are perpendicular to each other.

The first common column selection control unit 410 is located outside the first sub bank 110A in the first memory banks and the third sub bank 210A in the second memory banks in the first direction. The second common column selection control unit 420 is located outside the second sub bank 120A in the first memory banks and the fourth sub bank 220A in the second memory banks in the first direction.

The first common column selection control unit 410 commonly controls access to column areas in the first sub bank 110A of the first memory banks and the third sub bank 210A of the second memory banks, and generates column selection signals YI<0> to YI<i> which control data access to the corresponding memory cells in the first sub bank 110A of the first memory banks and the third sub bank 210A of the second memory banks.

The second common column selection control unit 420 commonly controls access to column areas in the second sub bank 120A of the first memory banks and the fourth sub bank 220A of the second memory banks, and generates column selection signals YI<0> to YI<i> which control data access to the corresponding memory cells in the second sub bank 120A of the first memory banks and the fourth sub bank 220A of the second memory banks.

The first data write unit 112A is configured to transfer write data to the first sub bank 110A, and the first data read unit 113A is configured to sense and amplify write data transferred from the first sub bank 110A. The second data write unit 122A is configured to transfer write data to the second sub bank 120A, and the second data read unit 123A is configured to sense and amplify write data transferred from the second sub bank 120A.

The third data write unit 212A is configured to transfer write data to the third sub bank 210A, and the third data read unit 213A is configured to sense and amplify read data transferred from the third sub bank 210A. The fourth data write unit 222A is configured to transfer write data to the fourth sub bank 220A, and the fourth data read unit 223A is configured to sense and amplify write data transferred from the fourth sub bank 220A.

The first data read and write units 113A and 112A and the second data read and write units 123A and 122A, which exchange data with the first memory banks BANK0_0 and BANK0_1 110A and 120A, are located at one side surface in the first memory banks BANK0_0 and BANK0_1 110A and 120A in the first direction. The third data read and write units 213A and 212A and the fourth data read and write units 223A and 222A, which exchange data with the second memory banks BANK1_0 and BANK1_1 210A and 220A, are located at one side surface in the second memory bank BANK1_0 and BANK1_1 210A and 220A in the first direction. For example, the read/write circuit area exchanging data with the first memory banks and the read/write circuit area exchanging data with the second memory banks are not adjacent. In this aspect, the read/write circuit area exchanging data with the first memory banks and the read/write circuit area exchanging data with the second memory banks are separated by the second memory banks.

To clarify the technical ideas proposed in this aspect, the following descriptions will focus on an access operation that reaches the first sub bank 110A in the first memory banks and the third sub bank 210A in the second memory banks. The description of an access operation to the second sub bank 120A in the first memory banks and the fourth sub bank 220A in the second memory banks will be omitted to avoid a duplicate description.

The column selection signals YI<0> to YI<i> are transferred to the column areas in the first and second memory banks through the common column selection signal transmission lines 511_0 to 511_i and 521_0 to 521_i. The write data WRITE DATA is transferred to the corresponding cells in the first and second memory banks through data transmission lines 711 and 712. The read data READ DATA transferred from the corresponding cells in the first and second memory banks is transferred to the outside through the data transmission lines 711 and 712. The first data transmission line 711 is connected to the first sub bank 110A in the first memory banks, and the second data transmission line 712 is connected to the third sub bank 210A in the second memory banks.

A column selection signal YI<k> controls data access to a memory cell, and the write data WRITE DATA transferred through the data transmission lines 711 and 712 is transferred to memory cells to which access is allowed. The read data READ DATA transferred from memory cells to which access is allowed may be transferred to the outside through the data transmission lines 711 and 712. Therefore, it is very important to secure a sufficient timing margin between the column selection signal YI<k> transferred through a common column selection signal transmission line and the data signal transferred through the data transmission line 711 or 712. Although the semiconductor memory apparatus comprises a large number of data transmission lines, FIG. 3 illustrates only the data transmission lines necessary to clearly explain technical ideas in the present invention.

When the first sub bank 110A in the first memory banks and a specific column selection signal YI<k> are activated, data access to the corresponding memory cell in the first sub bank 110A is allowed. Furthermore, when the third sub bank 210A in the second memory banks and the specific column selection signal YI<k> are activated, data access to the corresponding memory cell in the third sub bank 210A is allowed. The column selection signal YI<k> is then transferred through a common column selection signal transmission line. The column selection signal that controls the data access to the memory cell in the first sub bank 110A in the first memory banks and the column selection signal that controls the data access to the memory cell in the third sub bank 210A in the second memory banks are commonly transferred through the common column selection signal transmission line.

At this time, a transmission path of the column selection signal that controls the data access to the memory cell in the first sub bank 110A in the first memory banks is longer than that of the column selection signal that controls the data access to the memory cell in the third sub bank 210A in the second memory banks. Therefore, when the column selection signal that controls the data access to the memory cell in the first sub bank 110A of the first memory banks is transferred through the common column selection signal transmission line, the column selection signal slew rate may decrease due to the load value in the common column selection signal transmission line, such as capacitance. To prevent such a decrease in the column selection signal slew rate, column selection signal repeaters 611_0 to 611_i and 621_0 to 621_i may be inserted into the common column selection signal transmission lines 511_0 to 511 and 521_0 to 521_i, respectively. At this time, a skew difference between the column selection signal that controls the data access to the memory cell in the first sub bank 110A in the first memory banks and the column selection signal that controls the data access to the memory cell in the third sub bank 210A in the second memory banks may occur due to a delay value in the column selection signal repeater 611_k. Therefore, the column selection signal transferred to the second sub bank 120A may be generated by reflecting the delay value in the column selection signal repeater.

Now, the timings between the column selection signals YI<0> to YI<k> generated by the first common column selection control unit 410 and the write/read data transferred through the data transmission lines 711 and 712 will be explained in detail. The first column selection signal YI<0> transferred through the first common column selection signal transmission line 511_0 and the data signal (read/write data) transferred through the first data transmission line 711 are representative examples.

The first column selection signal YI<0> generated by the first common column selection control unit 410 is transferred to the first sub bank 110A in the first memory banks and the third sub bank 210A in the second memory banks through the first common column selection signal transmission line 511_0. At this time, the timing in the first column selection signal YI<0> transferred to a first node NODE A in the first common column selection signal transmission line 511_0 may be defined as timing at which data access to the corresponding memory cell in the third sub bank 210A in the second memory banks is controlled. The memory cell to which the data access is controlled by the time the first column selection signal YI<0> transfers read data or receives write data through the second data transmission line 712. Therefore, the timing margin between the column selection signal transferred to the first node NODE A in the first common column selection signal transmission line 511_0 and the data signal transferred to a second node NODE B in the second data transmission line 712 is very important, in terms of data input and output.

The semiconductor memory apparatus 3 according to this aspect is designed so that the first data read and write units 113A and 112A are located at one side surface in the first sub bank 110A in the first memory banks and the third data read and write units 213A and 212A are located at one side surface in the third sub bank 210A in the second memory banks. Therefore, the length of the transmission path in the first column selection signal YI<0> to the first node NODE A becomes substantially equal to that of the transmission path of the data signal to the second node NODE B. Furthermore, the length of a transmission path in a column selection signal in the other sub banks in the memory banks also becomes substantially equal to that of a transmission path in a data signal.

As a result, the timing difference between a column selection signal that controls data access to a memory cell in a memory bank and a data signal decreases the skew. Therefore, the timing margin for the data write and read operation is improved.

Figure 4:
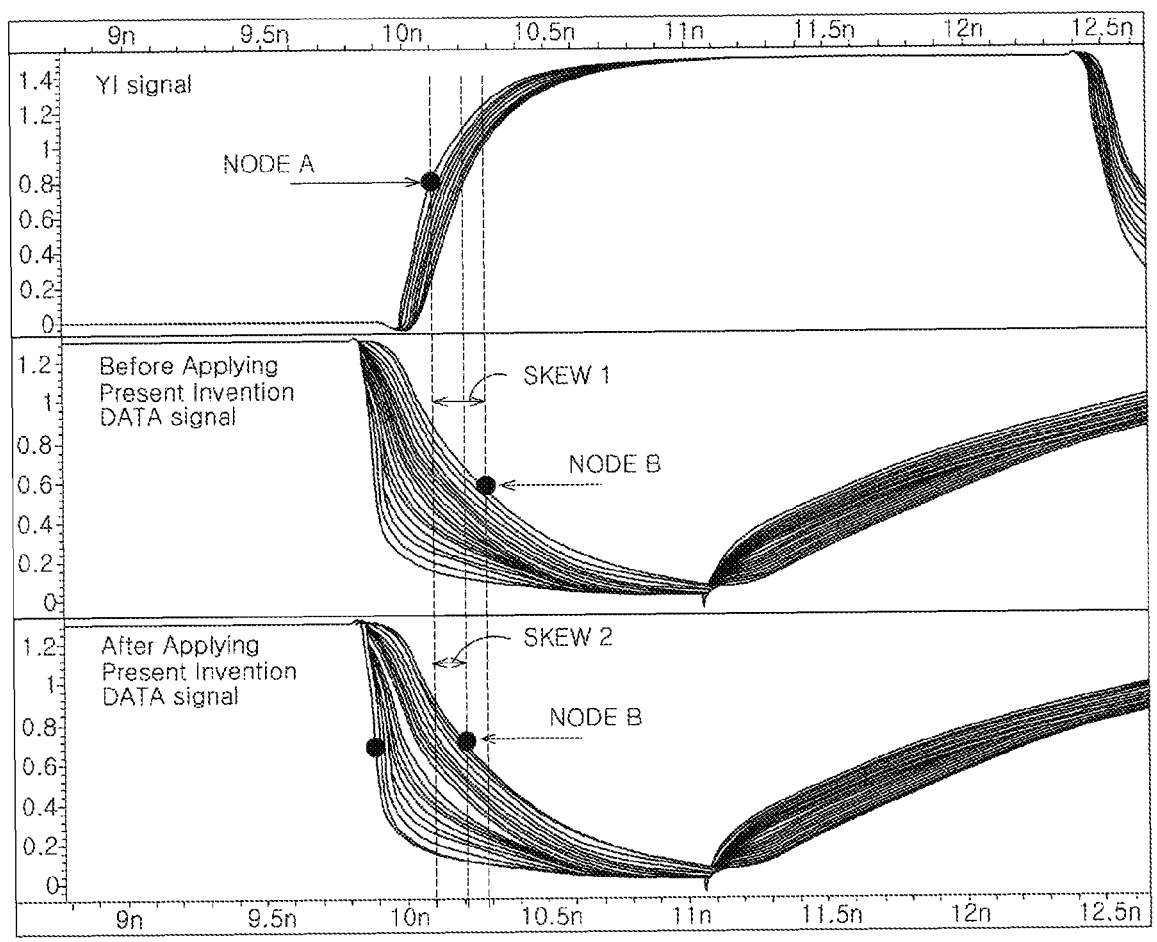
FIG. 4 illustrates a simulation result in the semiconductor memory apparatus according to the aspect.

FIG. 4 illustrates a simulation result in the semiconductor memory apparatus according to this aspect.

Referring to FIG. 4, the skew between a column selection signal and a data signal before the present invention is applied is comparable with that after the present invention is applied. The simulation result shows that the skew SKEW2 in the column selection signal after the present invention is applied is smaller than the skew SKEW1 in the column selection signal before the present invention is applied.

As described above, the semiconductor memory apparatus according to the aspects reduces the timing difference between a column selection signal that controls data access to a memory cell in a memory bank and a data signal, the skew. This result makes it possible to improve the timing margin for the data read and write operation.

While certain aspects have been described above, it will be understood to those skilled in the art that the aspects described are by way in example only. Accordingly, the apparatus described herein should not be limited based on the described aspects. Rather, the apparatus described herein should only be limited in light in the claims that follow when taken in conjunction with the above description and accompanying drawings.

What is claimed is:

1. A semiconductor memory apparatus comprising:
   first and second memory banks located at a predetermined distance from each other in a first direction;
   a common column selection control unit located at an outside region in the first and second memory banks in the first direction, and configured to commonly control access to column areas in the first and second memory banks and generate a column selection signal that controls data access to the corresponding memory cells in the first and second memory banks;
   a first data read/write unit configured to sense and amplify read data transferred from the column areas of the first memory bank and transfer write data to the column areas of the first memory bank; and
   a second data read/write unit configured to sense and amplify read data transferred from the column areas of the second memory bank and transfer write data to the column areas of the second memory bank,
   wherein the first data read/write unit and the second data read/write unit are located so as to be spaced from each other in the first direction with the memory bank interposed therebetween.

2. The semiconductor memory apparatus of claim 1, wherein the first data read/write unit is located at one side surface in the first memory bank in the first direction, and the second data read/write unit is located at one side surface in the second memory bank in the first direction.

3. The semiconductor memory apparatus of claim 1, wherein the column selection signal is transferred to the column areas in the first and second memory banks through a common column selection signal transmission line.

4. The semiconductor memory apparatus of claim 3, further comprising a column selection signal repeater inserted into the common column selection signal transmission line and configured to transfer the corresponding column selection signal that controls the data access to the memory cell in the first memory bank, wherein a transmission path of the column selection signal that controls the data access to the memory cell in the first memory bank is longer than that in the column selection signal that controls the data access to the memory cell in the second memory bank.

5. The semiconductor memory apparatus of claim 4, wherein when generating the column selection signal that controls the data access to the memory cell in the second memory bank, the common column selection control unit delays the column selection signal by a delay value of the column selection signal repeater.

6. The semiconductor memory apparatus of claim 1, wherein the column selection signal is a signal which is activated in response to a column address signal.

7. The semiconductor memory apparatus of claim 1, wherein the first and second memory banks are selectively activated in response to a bank address signal.

8. The semiconductor memory apparatus of claim 1, wherein the column selection signal controls data access to a memory cell in an activated memory bank in the first and second memory banks.

\* \* \* \* \*